United States Patent [19]

Jeng

[11] Patent Number: 5,612,248

[45] Date of Patent: Mar. 18, 1997

[54] METHOD FOR FORMING FIELD OXIDE OR OTHER INSULATORS DURING THE FORMATION OF A SEMICONDUCTOR DEVICE

[75] Inventor: Nanseng Jeng, Boise, Id.

[73] Assignee: Micron Technology, Inc., Boise, Id.

[21] Appl. No.: 540,866

[22] Filed: Oct. 11, 1995

[51] Int. Cl.⁶ .................................................. H01L 21/76
[52] U.S. Cl. .................................................. 437/69
[58] Field of Search ............................ 437/67, 69, 70, 437/72, 73; 148/DIG. 85

[56] References Cited

U.S. PATENT DOCUMENTS

| | | | |
|---|---|---|---|
| 4,398,992 | 8/1983 | Fang et al. | 437/72 |
| 4,563,227 | 1/1986 | Sakai et al. | 437/67 |
| 5,254,494 | 10/1993 | Van Der Plas et al. | 437/73 |
| 5,318,922 | 6/1994 | Lim et al. | 437/69 |
| 5,453,397 | 9/1995 | Ema et al. | 437/69 |
| 5,457,067 | 10/1995 | Han | 437/72 |
| 5,470,783 | 11/1995 | Chiu et al. | 437/69 |
| 5,472,906 | 12/1995 | Shimizu et al. | 437/69 |

FOREIGN PATENT DOCUMENTS

| | | | |
|---|---|---|---|
| 0092547 | 5/1984 | Japan | 437/72 |
| 0219148 | 9/1986 | Japan | 437/69 |
| 0014439 | 1/1987 | Japan | 437/73 |
| 0304927 | 12/1990 | Japan | 437/73 |

*Primary Examiner*—Trung Dang
*Attorney, Agent, or Firm*—Kevin D. Martin

[57] ABSTRACT

A method for forming a semiconductor device comprises the steps of forming an oxide over a silicon layer, forming a blanket first nitride layer over the oxide layer and the silicon layer, and etching the first nitride layer and the oxide layer to form a sidewall from at least the oxide layer and the first nitride layer. Next, a second nitride layer is formed over the sidewall and an oxidizable layer is formed over the second nitride layer. The oxidizable and the second nitride layers are etched to form a spacer from the oxidizable layer and the second nitride layer, and the oxidizable and the silicon layers are etched.

20 Claims, 2 Drawing Sheets

METHOD FOR FORMING FIELD OXIDE OR OTHER INSULATORS DURING THE FORMATION OF A SEMICONDUCTOR DEVICE

FIELD OF THE INVENTION

The invention relates to the field of semiconductor manufacture, and more specifically to the formation of an isolation region such as field oxide.

BACKGROUND OF THE INVENTION

Many types of semiconductor devices such as dynamic random access memories (DRAMs), static rams (SRAMs), programmable memories, and microprocessors are formed in much the same way. Layers of oxide, nitride, and polycrystalline silicon (polysilicon or poly) are formed over a substrate such as silicon to form field and gate oxide, capacitor cell plates, word and digit lines, and various other structures.

To form a thick oxide layer such as field oxide, a thin blanket oxide layer is formed over a substrate. A blanket layer of protective material such as nitride is formed over the oxide layer, and a patterned mask is formed over the protective layer to cover regions of protective material while other regions of protective material remain exposed. The exposed protective regions (and often the underlying oxide layer) is etched to expose the underlying oxide layer (or underlying substrate). The substrate is then oxidized to form the field oxide. Other procedures using the local oxidation of silicon (LOCOS) are known.

Encroachment of isolation material such as oxide under adjacent nitride during field oxidation is well documented. Encroachment decreases the size of the usable silicon area for transistor formation, thereby decreasing transistor packing density on silicon. The following patents assigned to Micron Technology, Inc. are related to encroachment and/or field oxide, and are incorporated by reference: U.S. Pat. No. 4,959,325 issued Sep. 25, 1990; U.S. Pat. No. 4,965,221 issued Oct. 23, 1990; U.S. Pat. No. 5,049,520 issued Sep. 17, 1991; U.S. Pat. No. 5,087,586 issued Feb. 11, 1992; U.S. Pat. No. 5,118,641 issued Jun. 02, 1992; U.S. Pat. No. 5,332,682 issued Jul. 26, 1994; U.S. Pat. No. 5,358,894 issued Oct. 25, 1994; U.S. Pat. No. 5,438,016 issued Aug. 01, 1995.

A process which reduces field oxide encroachment effects to maximize the usable silicon area during the formation of a transistor would be desirable.

SUMMARY OF THE INVENTION

In one embodiment of a method for forming a semiconductor device a first insulation-resistant layer, which forms at least a portion of a sidewall, is formed over a semiconductor layer. A second insulation-resistant layer is formed over at least a portion of the sidewall, and an oxidizable layer is formed over the second insulation-resistant layer. The oxidizable layer is oxidized along with a portion of the semiconductor layer.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
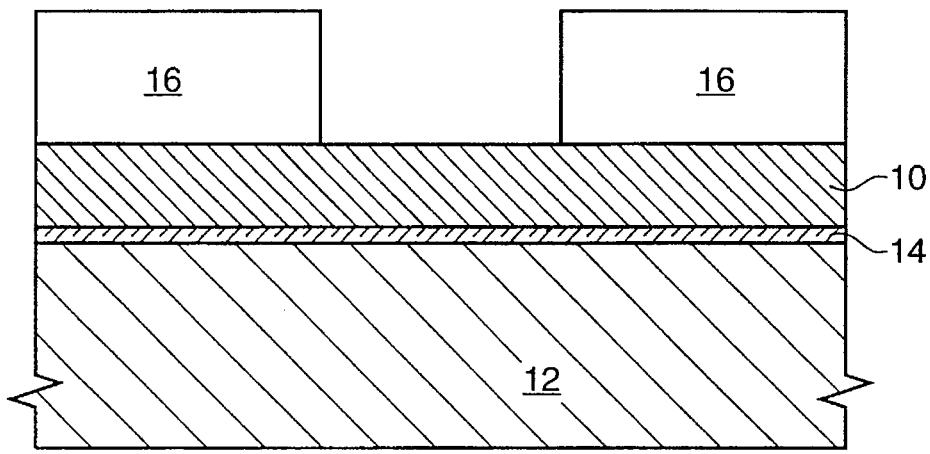
FIGS. 1–5 are cross sections describing various stages of one possible embodiment of the invention.
Figure 2:
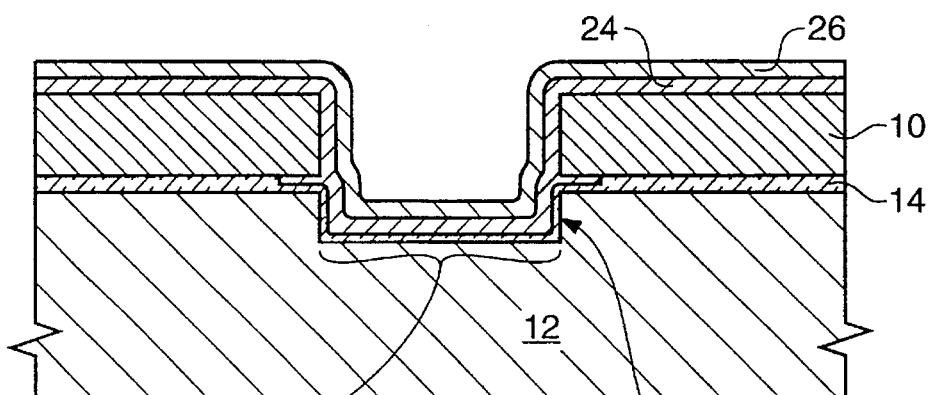

One embodiment of an inventive method for forming a semiconductor device comprises the steps of forming a patterned first insulation-resistant layer 10 such as nitride over a semiconductor layer 12 such as a silicon substrate, as shown in FIG. 1. An interposed buffer layer 14, for example a pad oxide insulation layer, can optionally be used to reduce the possibility of damage to the semiconductor layer 12. Patterning of the insulation-resistant layer can be completed by forming a mask layer 16 over a blanket insulation-resistant layer then etching the insulation-resistant layer to result in the layers of FIG. 2. If the buffer layer is used it may be etched to undercut the first insulation-resistant layer such that a space is formed between the first insulation-resistant layer and the semiconductor layer. As shown in FIG. 2, the first insulation-resistant layer forms at least a portion of a sidewall. Also shown in FIG. 2, a portion of the substrate 12 is optionally etched to form a trench 20 in the substrate 12, either with a single etch or with a different etch from the first insulation-resistant layer etch, and the sidewall is formed by the buffer layer and the substrate as well as the first insulation-resistant layer. The substrate is then oxidized 22 to reduce damage from subsequent layers.

Figure 3:
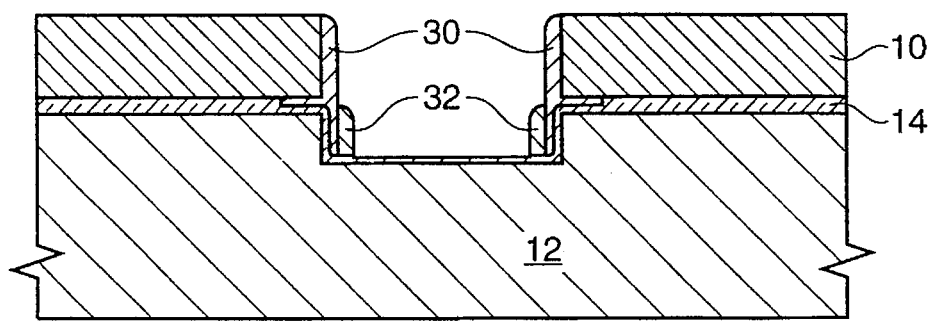

Next, a second insulation-resistant layer 24, for example of nitride, is formed over the sidewall and an oxidizable layer 26 is formed over the second insulation-resistant layer as shown in FIG. 2. If the buffer layer 14 is undercut, the second insulation-resistant layer 24 will fill in the space resulting from the etch as shown in FIG. 2. The oxidizable layer 26 can be silicon, for example polycrystalline silicon, although other materials may function adequately. An anisotropic etch such as a spacer etch is completed to etch the second insulation-resistant layer and the oxidizable layer to result in the insulation-resistant layer 30 and the oxidizable layer 32 as shown in FIG. 3.

Figure 4:
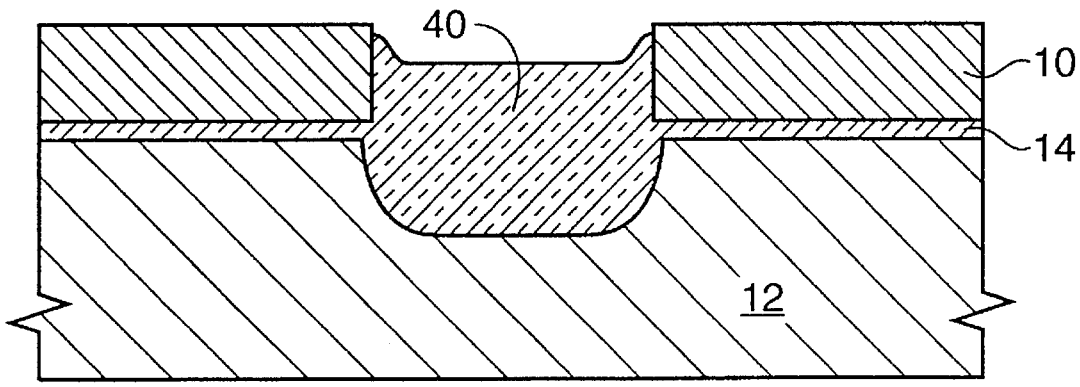
Figure 5:
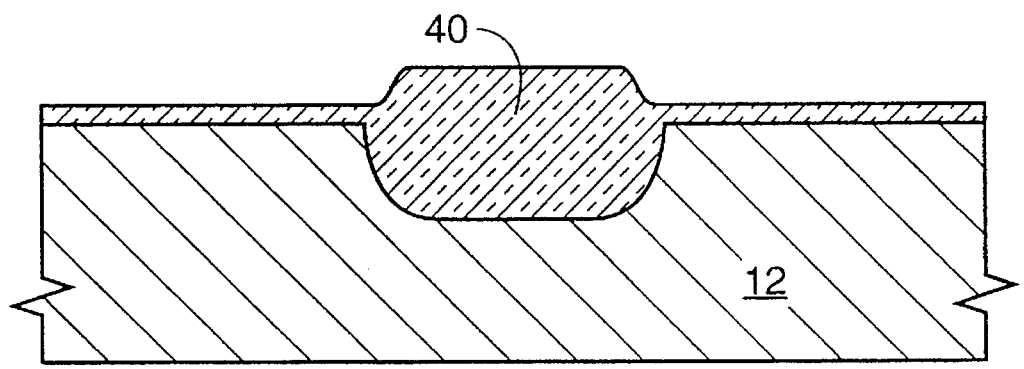

The oxidizable layer is oxidized, which consumes the oxidizable layer quickly, consumes the substrate more slowly than the oxidizable layer, and even more slowly oxidizes the second insulation-resistant layer. Ideally, just as the second insulation-resistant layer is completely oxidized, the oxide layer to be formed (for example field oxide) is completed thereby minimizing the encroachment of the oxide under the first insulation-resistant layer to result in the oxide structure 40 of FIG. 4, such as field oxide. Any remaining portion of the first insulation layer 10 is removed to result in the structure of FIG. 5.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a semiconductor device comprising the following steps:
   a) forming a first insulation-resistant layer over a semiconductor layer, said first insulation-resistant layer forming at least a portion of a sidewall;
   b) forming a second insulation-resistant layer over said sidewall;
   c) forming an oxidizable layer over said second insulation-resistant layer; and
   d) oxidizing said oxidizable layer, a portion of said semiconductor layer, and completely oxidizing said second insulation-resistant layer over said sidewall.

2. The method of claim 1 further comprising the step of etching said first insulation-resistant layer and said semiconductor layer during a single etch step to form a trench in said semiconductor layer, wherein said sidewall comprises said semiconductor layer and said first insulation-resistant layer.

3. The method of claim 2 wherein said oxidizable layer is formed in said trench.

4. The method of claim 1 wherein said second insulation-resistant layer is oxidized during said step of oxidizing said oxidizable layer.

5. The method of claim 1 wherein said oxidizable layer comprises silicon.

6. The method of claim 1 further comprising the step of etching a blanket insulation-resistant layer to form said first insulation-resistant layer.

7. The method of claim 1 further comprising the following steps:
   a) forming an insulation layer over said semiconductor layer prior to forming said first insulation-resist layer;
   b) undercutting said insulation under said first insulation-resistant layer, said first insulation-resistant layer and said semiconductor layer having a space therebetween resulting from said undercut;
   c) filling said space with said second insulation-resistant layer during said step of forming said second insulation-resistant layer over said sidewall.

8. A method for forming a semiconductor device comprising the following steps:
   a) forming an oxide layer over a silicon layer;
   b) forming a first nitride layer over said oxide layer and said silicon layer, said nitride layer and said oxide layer forming at least a portion of a sidewall;
   c) forming a second nitride layer over said sidewall;
   d) forming an oxidizable layer over said second nitride layer; and
   e) oxidizing said oxidizable layer, a portion of said silicon layer, and completely oxidizing said second nitride layer over said sidewall.

9. The method of claim 8 wherein said step of oxidizing forms field oxide.

10. The method of claim 8 further comprising the step of forming a trench in said silicon layer prior to said step of forming said second nitride layer.

11. The method of claim 10 wherein said oxidizable layer is formed within said trench.

12. The method of claim 8 wherein said second nitride layer is oxidized during said step of oxidizing said oxidizable layer.

13. The method of claim 8 wherein said oxidizable layer comprises silicon.

14. The method of claim 8 further comprising the following steps:
   a) etching said oxide layer under said first nitride layer during said etch step, said first nitride layer and said silicon layer having a space therebetween resulting from said etch;
   b) filling said space with said second nitride layer during said step of forming said second nitride layer over said sidewall.

15. A method for forming a semiconductor device comprising the following steps:
   a) forming an oxide over a silicon layer;
   b) forming a blanket first nitride layer over said oxide layer and said silicon layer;
   c) etching said first nitride layer and said oxide layer to form a sidewall from at least said oxide layer and said first nitride layer;
   d) forming a second nitride layer over said sidewall;
   e) forming an oxidizable layer over said second nitride layer;
   f) etching said oxidizable layer and said second nitride layer to form a spacer from said oxidizable layer and said second nitride layer;
   g) oxidizing said oxidizable layer, a portion of said silicon layer, and completely oxidizing said second nitride layer Which comprises said spacer.

16. The method of claim 15 wherein said silicon is etched to form a trench during said step of etching said first nitride layer and said oxide layer, and said sidewall is formed from at least said first nitride layer, said oxide layer, and said silicon.

17. The method of claim 16 wherein said oxidizable layer is formed within said trench.

18. The method of claim 15 further comprising the following steps:
   a) etching said oxide layer under said first nitride layer during said step of etching said first nitride and said oxide, said first nitride layer and said silicon layer having a space therebetween resulting from said etch;
   b) filling said space with said second nitride layer during said step of forming said second nitride layer over said sidewall.

19. The method of claim 15 wherein said second nitride layer is oxidized during said step of oxidizing said oxidizable layer.

20. The method of claim 18 wherein said oxidizable layer comprises polycrystalline silicon and said step of oxidizing forms field oxide.

* * * * *